(12) United States Patent
Hazama et al.

(10) Patent No.: US 6,934,211 B2
(45) Date of Patent: Aug. 23, 2005

(54) DRAM WITH REFRESH CONTROL FUNCTION

(75) Inventors: Toshikatsu Hazama, Kanagawa (JP); Masaaki Kuwagata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/602,117

(22) Filed: Jun. 23, 2003

(65) Prior Publication Data

US 2004/0047205 A1 Mar. 11, 2004

(30) Foreign Application Priority Data

Jun. 24, 2002 (JP) .................................... 2002-182556

(51) Int. Cl.$^7$ ................................................ G11C 7/00
(52) U.S. Cl. .................. 365/222; 365/149; 365/230.03
(58) Field of Search ................................ 365/222, 149, 365/230.03

(56) References Cited

U.S. PATENT DOCUMENTS 5,623,451 A * 4/1997 Kawagoe .................... 365/222
6,058,061 A * 5/2000 Ooishi ........................ 365/222
6,349,068 B2 * 2/2002 Takemae et al. ............ 365/222

FOREIGN PATENT DOCUMENTS

JP          05-109268          4/1993

* cited by examiner

Primary Examiner—Hoai Ho
(74) Attorney, Agent, or Firm—Hogan & Hartson, LLP

(57) ABSTRACT

A dynamic random access memory (DRAM) has a refresh-control function under control by an internal refresh-control signal. The DRAM includes: a cell array having a plurality of DRAM cells divided into a plurality of blocks, the DRAM cells being driven through word lines for data transfer with bit lines; a decoder to select word lines and bit lines connected to the cell array; a sense amplifier to amplify data on the bit lines; and a refresh controller to limit refresh to the cell array so that at least one externally-accessed block cell among the blocks is refreshed.

14 Claims, 10 Drawing Sheets

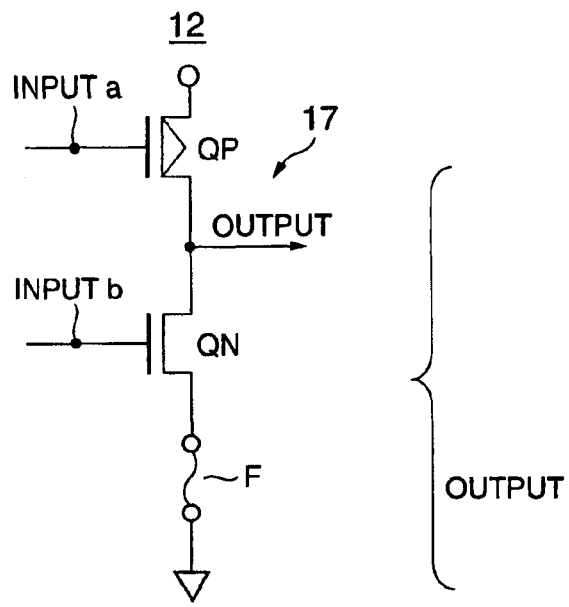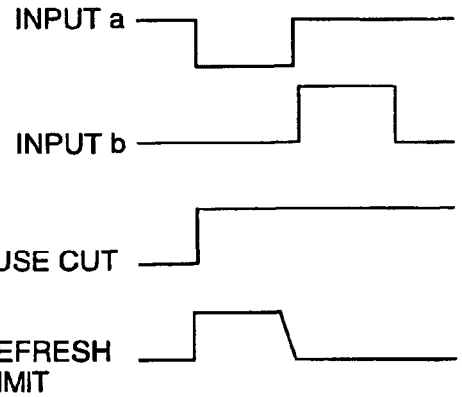
FIG. 10    FIG. 11
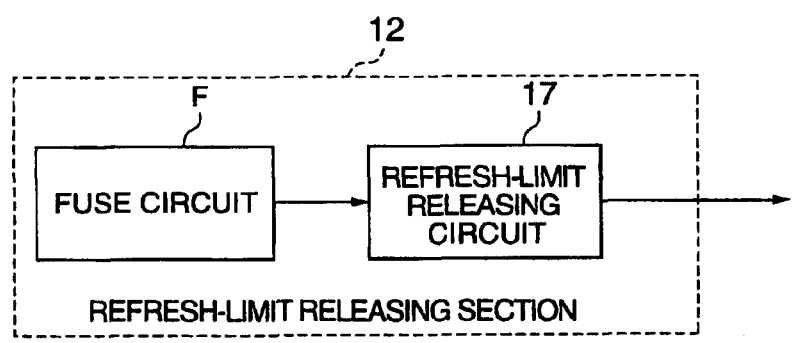
FIG. 12
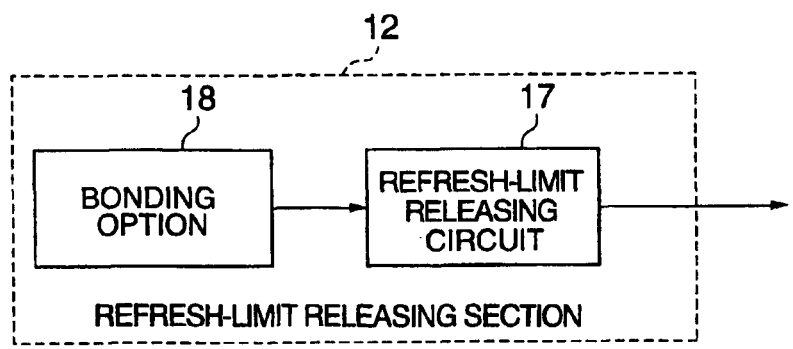
FIG. 13

DRAM WITH REFRESH CONTROL FUNCTION

CROSS REFERENCE TO RELATED APPLICATIONS

This application claims benefit of priority under 35 USC § 119 to Japanese Patent Application No. 2002-182556, filed on Jun. 24, 2002, the entire contents of which are incorporated by references herein.

BACKGROUND OF THE INVENTION

The present invention relates to a dynamic random access memory (DRAM) having a refresh control function. Particularly, this invention relates to a DRAM having a refresh control function to limit excess refresh operations.

DRAM cells store data as charges that are reduced due to junction leakage, etc. Therefore, DRAMs require a refresh operation for reading and rewriting cell data from and to each cell.

The following are major two types of DRAM refresh:
(A) external address entry to initiate refresh operation; and
(B) internal address generation for refreshing with a built-in-chip address-counter, with no external address entry.

The type (A) includes RAS-only refresh, CAS before-RAS refresh, etc.

RAS-only refresh is to input row addresses in synchronism with row-address strobes (abbreviated as *RAS hereinafter) to select and drive each word line.

CAS before-RAS refresh is to make column-address strobes (abbreviated as *CAS hereinafter) at level "LOW" prior to *RAS in refreshing while *RAS and *CAS are always appearing at different timings.

The symbol "*" added to each signal indicates that the signal has been inverted. For example, *RAS means that a signal RAS has been inverted.

The type (B) includes auto refresh, self refresh, etc.

Auto refresh is to generate internal addresses for refreshing, in synchronism with a control signal given via a refresh-control terminal during a period of level "HIGH" (inactive period) for *RAS.

Self refresh is to generate internal addresses for refreshing per specific period of time with an internal timer.

A known DRAM having a refreshing function is DYNAMIC TYPE SEMICONDUCTOR MEMORY disclosed in Japanese Unexamined Patent Publication No. 5-109268.

The known DRAM is a type-(B) DRAM, having a memory-cell array divided into several memory subarrays with different refreshing periods per sub array, to limit excess refresh operations for reduction of power consumption.

The type-(A) refresh requires external addresses but flexible in selection of refreshing regions in cell array.

In contrast, the type-(B) refresh inhibits selection of refreshing regions, thus requiring refreshing to all regions in Dram chip, including no-data-stored regions. The type-(B) refresh thus causes excess refresh operations to increase power consumption.

The known DRAM is provided with different refreshing periods to avoid such excess refresh operations. Nevertheless, the known DRAM is not equipped with a refresh-control function in accordance with frequency in use of DRAM chip regions. In particular, it is not equipped with a function of halting unnecessary refreshing to no-data-stored regions.

SUMMARY OF THE INVENTION

A dynamic random access memory (DRAM) having a refresh-control function under control by an internal refresh-control signal according to the present invention includes: a cell array having a plurality of DRAM cells divided into a plurality of blocks, the DRAM cells being driven through word lines for data transfer with bit lines; a decoder to select word lines and bit lines connected to the cell array; a sense amplifier to amplify data on the bit lines; and a refresh controller to limit refresh to the cell array so that at least one externally-accessed block cell among the blocks is refreshed.

BRIEF DESCRIPTION OF DRAWINGS

FIG. 10 shows an exemplary fuse circuit;

FIG. 11 shows a timing chart indicating signal timing for each circuit component shown in FIG. 10;

FIG. 12 shows an exemplary block diagram of a refresh-limit releasing section;

FIG. 13 shows an exemplary block diagram of a refresh-limit releasing section;

DETAILED DESCRIPTION OF PREFERRED EMBODIMENT

An embodiment according to the present invention will be disclosed with reference to the attached drawings.

Disclosed below is an embodiment of DRAM having memory cell arrays divided into blocks, information being charged into each cell, refreshing being decided per block.

Refresh limitation in this invention applies no refresh to a block of memory cells to which no access has been made.

Refresh-limit release in this invention releases a block of memory cells from refresh limitation when access has been made to at least one cell of the block, thus all cells in the block being refreshed.

Figure 1:
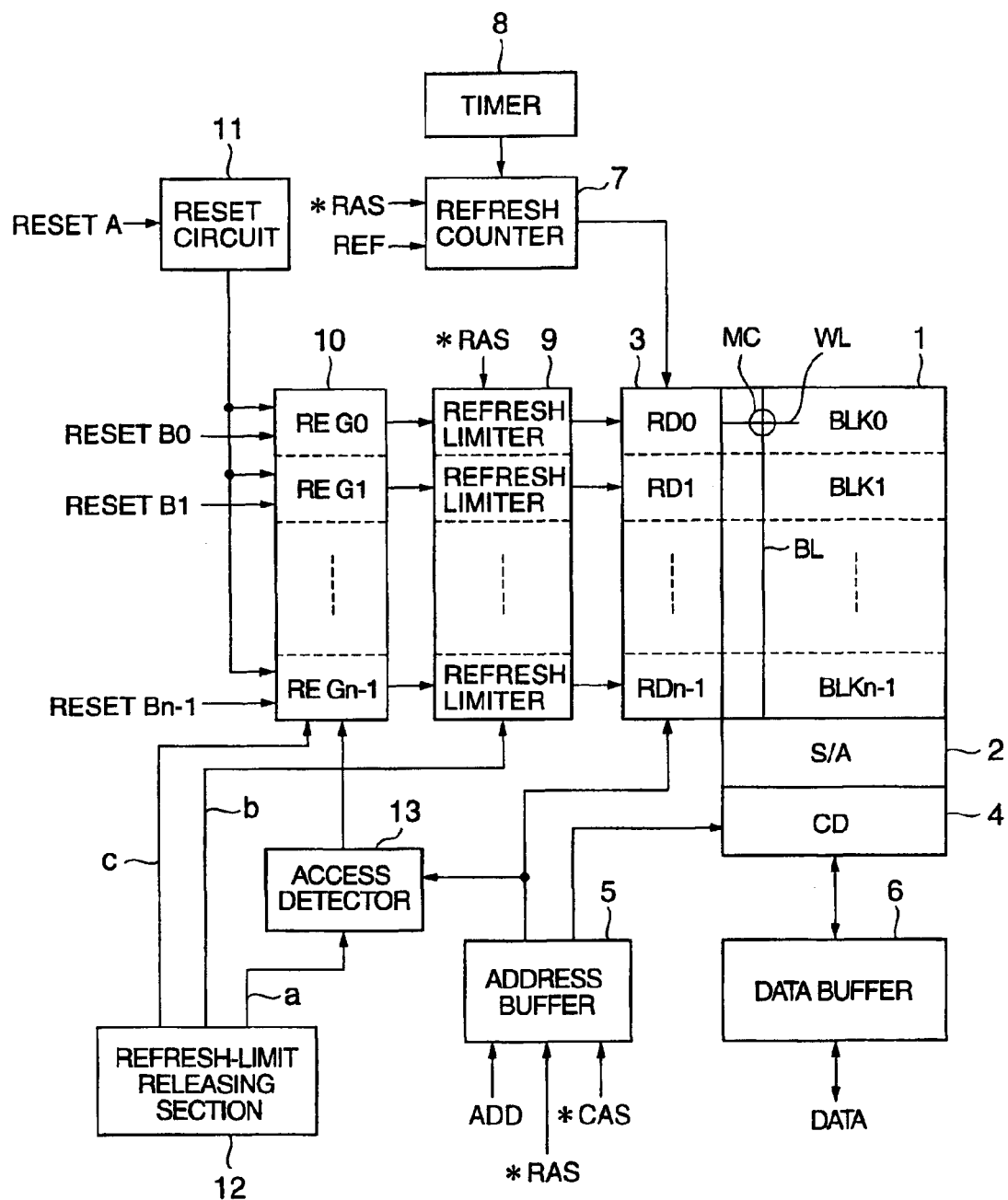
FIG. 1 shows a block diagram of an embodiment of DRAM according to the present invention.

FIG. 1 shows a block diagram of an embodiment of DRAM according to the present invention.

A cell array 1 has DRAM memory cells MC arranged on the intersections of word lines WL and bit lines BL.

Connected to each bit line BL is a sense amplifier 2 for amplifying data on the bit line BL.

Row decoders 3 select word lines with decoding row-address signals.

Column decoders 4 select bit lines with decoding column-address signals.

An external address signal ADD is supplied to an address buffer 5 in synchronism with signals *RAS and *CAS, thus internal row- and column-address signals being supplied to the row decoders 3 and the column decoders 4, respectively.

Sense amplifiers 2 are selectively connected to a data buffer 6 via the column decoder 4 for data transfer via external terminals (not shown).

This embodiment is the self-refresh type, so that it is equipped with a refresh counter 7 and a timer 8 for automatic refreshments to the cell array 1 in an idle mode for this DRAM chip (with no data read and write).

The refresh counter 7 is an address counter to generate an internal row address that is increased per constant elapse of time decided by the timer, under control by the signal *RAS at level "HIGH" (inactive) and a refresh-control signal REF.

A row-address signal output from the refresh counter 7 is supplied to the row decoders 3. It is decoded to select word lines WL to refresh data in DRAM cells connected to the selected word lines WL. Data in the DRAM cells are read out to the corresponding bit lines BL, amplified by the sense amplifiers 2 and rewritten in the DRAM cells.

As disclosed, all blocks of the cell array 1 are refreshed one by one during a period of no external access in the self-refresh type.

In addition, a feature of the embodiment is to limit refreshing so that refreshing is allowed only for externally-accessed blocks of the cell array 1.

This feature is achieved with registers 10 and refresh limiters 9. Each register 10 is provided per several blocks of the cell array 1, to store access information indicating whether access has been made to the several blocks. The refresh limiters 9 output inhibit signals to inhibit refreshing un-accessed blocks of the cell array 1.

The cell array 1 is divided into "n" number of cell blocks BLK0, BLK1, . . . , and BLKn−1 per several word lines. In order to allow or inhibit refreshing per block, "n" number of the registers 10, REG0, REG1, . . . , and REGn−1 are provided. Each register 10 stores a value "0" at the initial stage.

When there is an external access, an access detector 13 detects a row address carried by the external access and sets "1" in the register 10 for the corresponding cell block. The access detector 13 is a block decoder to decode a block address, for the cell array 1, carried by the row-address signal.

Thus, the registers 10 store "0" for non-accessed cell blocks whereas "1" for accessed cell blocks, as the access information indicating whether access has been made.

Based on the access information, the refresh limiters 9 deactivate row address decoders 9 corresponding to non-accessed blocks, at the time of refreshing.

In detail, the refresh limiters 9 are activated by the signal *RAS only for a period *RAS="HIGH" for refreshing, to activate or de activate the row decoders 3 in accordance with the access information stored in the registers 10. The refresh limiters 9 are deactivated for a period *RAS="LOW" for data reading or writing so that the access information can be used only in the refreshing cycle.

As disclosed, the embodiment eliminates refresh operatrions to the cell array 1 in accordance with the access information indicating whether access has been made, thus reducing unnecessary power consumption.

The access information stored in the registers 10 may only indicate whether write access has been made. This eliminates unnecessary refreshing to the blocks of no data written in the cell array 1.

The registers 10 are provided with external reset terminals RESET0, RESET1, . . . , and RESETn−1, as shown in FIG. 1, for resetting the access information per several blocks.

The external reset terminals allow users to reset at "0" any of the registers 10 set at "1" (once accessed), to inhibit refresh operatrions to any blocks of the cell array 1 until the blocks are accessed next.

Further provided in FIG. 1 is a reset circuit 11 for initializing all registers 10.

The reset circuit 11 is a register which is feasible in the following situation.

When all registers 10 are set at "1" (once accessed) for all blocks of the cell array 1 in a test mode, refresh operatrions could continue even though no data are written after the "1"-settings.

In order to avoid unnecessary refresh operatrions, a reset signal RESETA is supplied to the reset circuit 11 to initialize all registers 10 set at "1" in the test mode. The initialization allows refresh operatrions only to the blocks of the cell array 1 accessed for writing after the registers 10 are initialized, thus achieving refresh limitation.

Several reset circuits 11 may be provided for initialization of the corresponding number of groups of the registers 10.

As disclosed above, the refresh limiting operation to the cell array 1 divided into several blocks in accordance with the access information achieves reduction of power consumption.

Nevertheless, the refresh limiting operation is of no use when all blocks of the cell array 1 are accessed. In other words, the access detector 13 determines whether there is an access for all blocks of the cell array 1 even when the block are all accessed, thus increasing power consumption.

In order to avoid such a problem, the present invention offers a programmed refresh limiting function for halting refresh operations, according to needs.

In detail, the embodiment shown in FIG. 1 is equipped with a refresh-limit releasing section 12 for releasing the registers 10 and the refresh limiters 9 from the refresh limiting operations.

In detail, the refresh-limit releasing section 12 is programmed with specific data to generate first to third operation-halt signals "a", "b" and "c" for deactivating the refresh limiters 9, the registers 10 and the access detector 13. The deactivation allows the normal self refresh with saving power which could otherwise be consumed by the refresh limiters 9, the registers 10 and the access detector 13.

Deactivating all of the refresh limiters 9, the registers 10 and the access detector 13 achieves maximum power saving in self refresh.

Nevertheless, the refresh-limit releasing operation is achieved with deactivating the refresh limiters 9 only or deactivating the access detector 13 only while setting "1" in all of the registers 10 with the refresh limiters 9 being active.

The refresh-restriction releasing section 12 may be of a fuse circuitry shown in FIG. 2(a) or a bonding potion shown in FIG. 2(b) so that specific data can be programmed on a DRAM wafer. Moreover, it may be of a non-volatile memory cell for storing programmed data permanently or an externally-settable and -resettable register.

As disclosed above, the present invention allows refreshing operations only to the externally-accessed blocks of a cell array, thus reducing DRAM power consumption.

An exemplary refresh circuitry according to the present invention includes: a refresh counter for generating an internal address signal, the address being increased for refreshing a cell array; a register, provided per several number of blocks of the cell array, for storing information indicating whether each block has been accessed; and a refresh limiter for halting a refresh operation to each block that has not been accessed.

As disclosed above in detail, the present invention offers refresh control to inhibit refresh operations to non-accessed blocks of a cell array, thus reducing DRAM power consumption.

Figure 2:
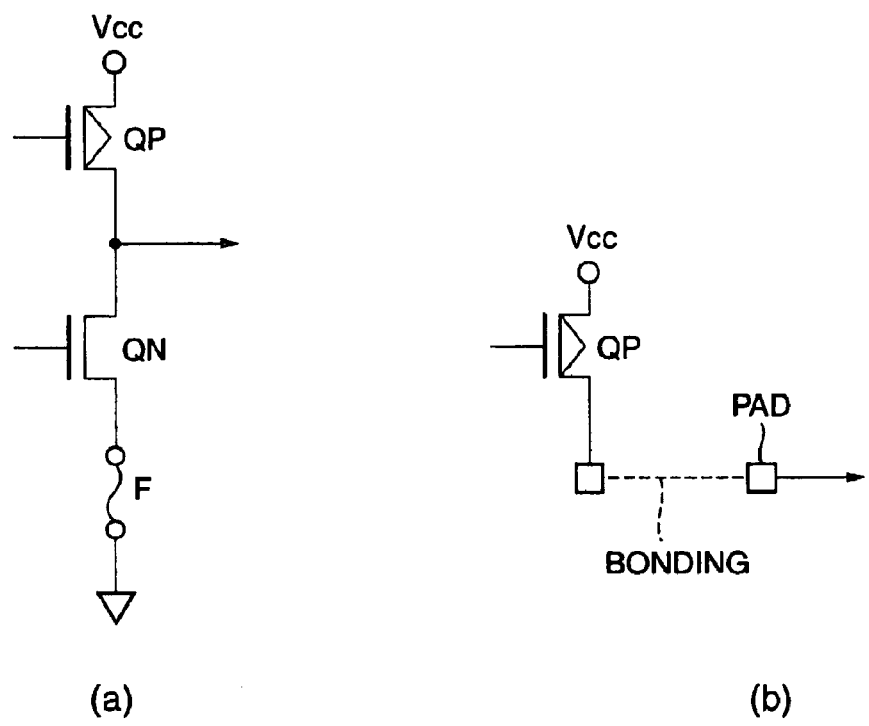
FIG. 2 shows exemplary circuit components of a refresh-limit releasing section.

The embodiment disclosed with reference to FIG. 2 will be disclosed in more detail.

Figure 3:
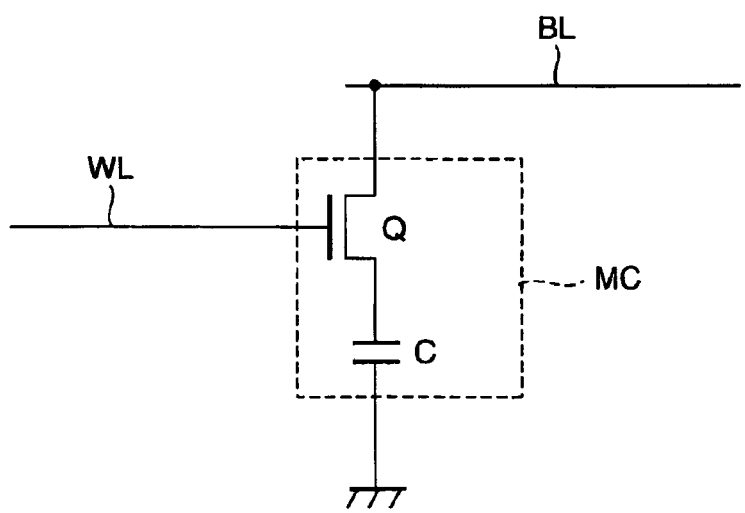
FIG. 3 shows a circuit diagram of a memory cell MC.

FIG. 3 shows a circuit diagram of the memory cell MC shown in FIG. 1.

The memory cell MC shown in FIG. 3 includes a transistor Q, the gate of which is connected to a word line WL, the drain of which is connected to a bit line BL, and a capacitor C connected between the emitter of the transistor Q and the ground.

Figure 4:
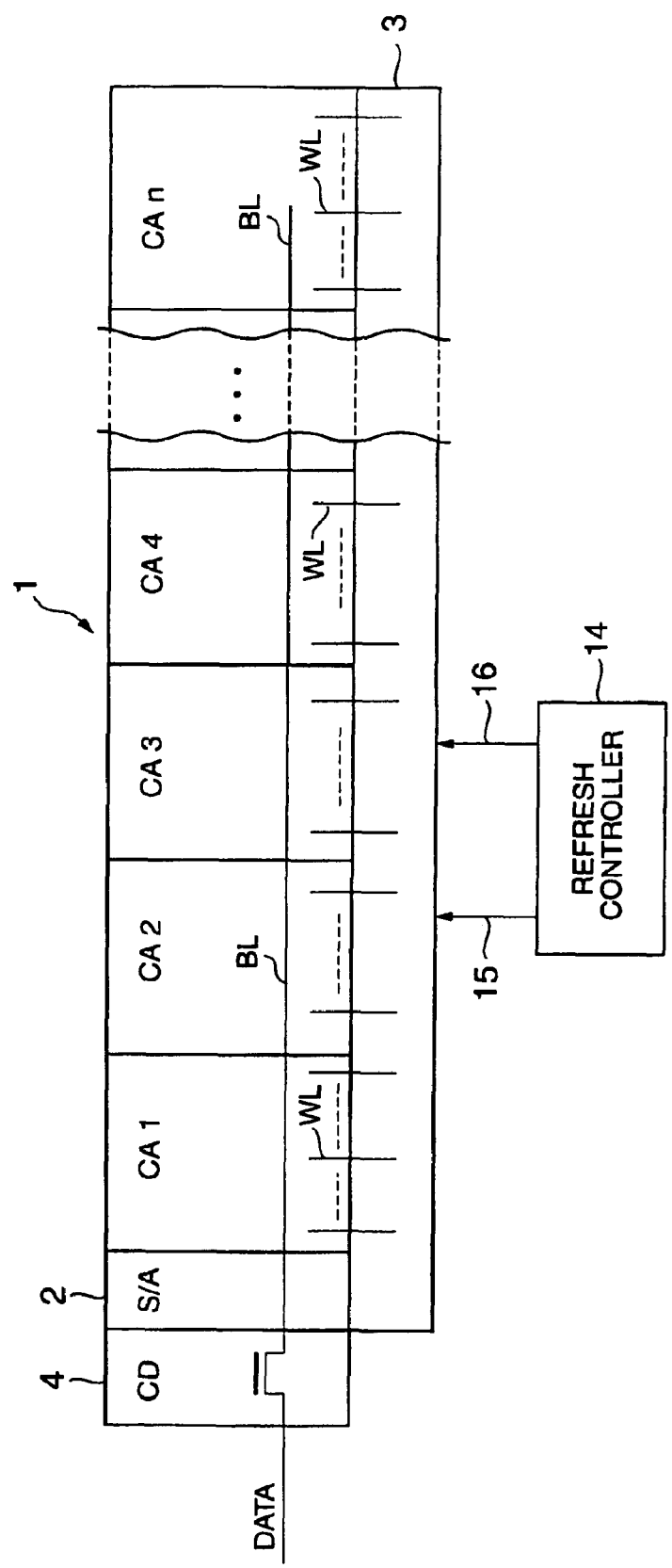
FIG. 4 shows a block diagram of a cell array divided into blocks and a refresh controller.

FIG. 4 shows a DRAM having a refresh control function under control by an internal refresh-control signal.

The DRAM shown in FIG. 4 includes: a cell array 1 having DRAM cells, each being driven through a word line for data transfer between a bit line, the cells being divided into and blocks CA1, CA2, CA3, CA4, . . . , and CAn; a decoders 3 and 4 for selecting word lines WL and bit lines BL, respectively; a sense amplifier 2 for amplifying bit-line data from the cell array; and a refresh controller 14 for controlling refreshing operations so that an externally accessed block is only refreshed among the blocks CA1, CA2, CA3, CA4, . . . , and CAn.

The refresh controller 14 supplies an internal refresh-control signal 15 and a refresh address signal 16 to the word-line selection decoder 3.

Figure 5:
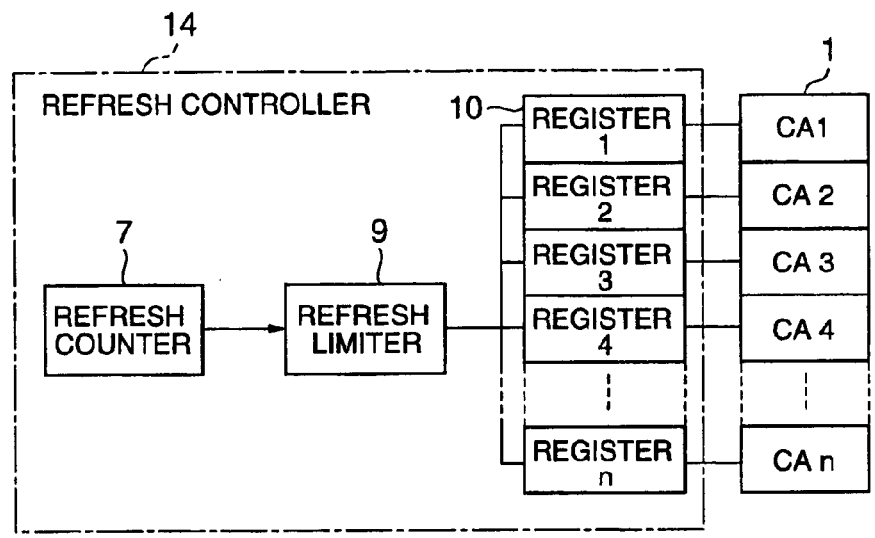
FIG. 5 shows an exemplary block diagram of the refresh controller.

FIG. 5 shows an exemplary block diagram of the refresh controller 14.

The refresh controller 14 shown in FIG. 5 includes: a refresh counter 7 for generating a refresh address 16, an internal address signal, increased for each refresh of the cell array 1; a register 10 (registers 1 to n) provided for each of the blocks CA1 to CAn for storing access information indicating whether each block has been accessed; and a refresh limiter 9 for inhibiting refresh to un-accessed blocks among the blocks CA1 to CAn, based on the access information.

The refresh limiter 9 decides whether to make refresh based on data in the register 10 corresponding to a refresh address, and outputting a signal indicating refresh or non-refresh.

The registers 1 to n store information indicating whether the corresponding blocks CA1 to CAn have been accessed. The information for refresh access may carry an address at which write and read accesses have been made or write access has only been made.

Figure 6:
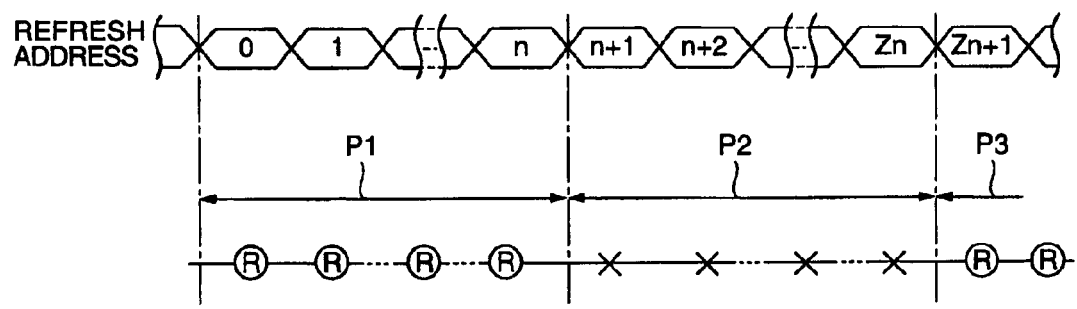
FIG. 6 shows an illustration of refresh addresses and periods of refreshing and non-refreshing.

FIG. 6 illustrates refresh addresses and the registers 1 to 3 for refresh and non-refresh operations.

Refresh addresses 0, 1, . . . , n, n+1, n+2, 2n+1, . . . , are generated sequentially.

Refresh operations are performed as indicated by circles R in a block CA1 of the cell array for a period P1 of generating refresh addresses indicating that access has been made to the block CA1.

On the contrary, refresh operations are not performed (non-refresh) as indicated by symbols "x" in a block CA2 of the cell array for a period P2 of generating refresh addresses indicating that no access has been made to the block CA2.

Refresh operations resume for a period P3 in which access has been made to the register 3.

Figure 7:
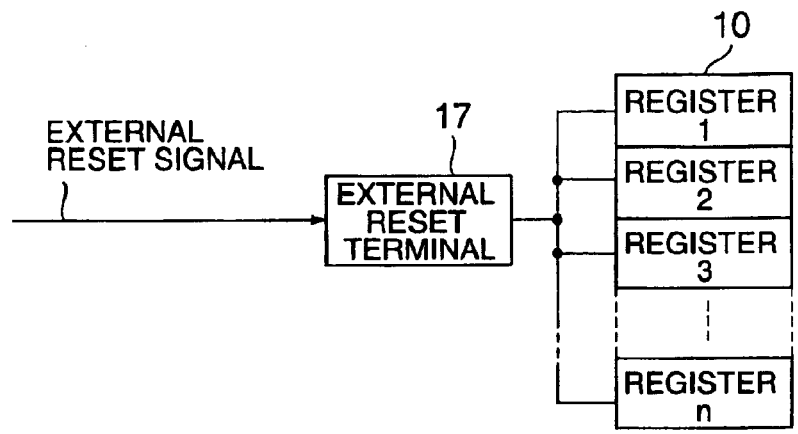
FIG. 7 shows a block diagram of circuitry having an external reset terminal.

FIG. 7 shows a block diagram of circuitry further having an external reset terminal 17 for initializing information stored in the register 10 per block of the cell array.

An external rest signal is supplied to any one of the registers 1 to n in the register 10 via the external reset terminal 17.

Figure 8:
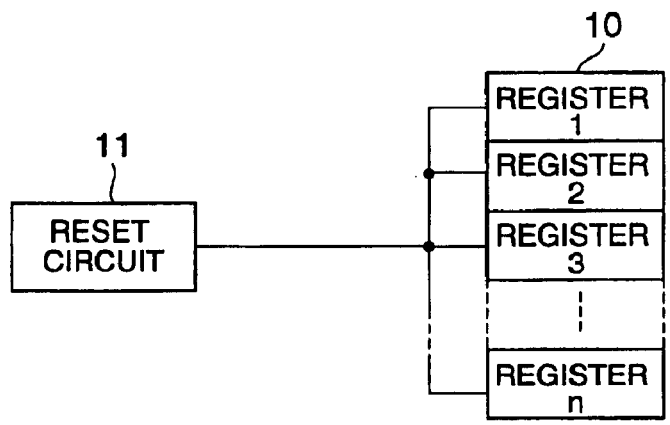
FIG. 8 shows a block diagram of circuitry having a reset circuit.

FIG. 8 shows a block diagram of circuitry further having a reset circuit 11 for initializing information stored in the register 10, which is equivalent to the combination of the reset circuit 11 and the register 10 shown in FIG. 1.

Figure 9:
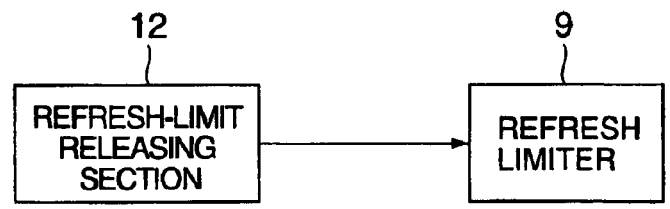
FIG. 9 shows a block diagram of a refresh-limit releasing section and a refresh limiter.

FIG. 9 shows a block diagram of circuitry further having a refresh-limit releasing section 12 that is data programmable for releasing the refresh limiter 9 from the refresh limiting function.

The refresh-limit releasing section 12 may be of a fuse circuit F such as shown in FIG. 10.

The refresh-limit releasing section 12 (fuse circuit F), almost identical to the counterpart shown in FIG. 2(a), generates a voltage OUTOUT that is a source-emitter voltage between an input "a" to the gate of a P-channel transistor QP and an input "b" to the gate of an N-channel transistor QN.

In operation, as illustrated in FIG. 11, when two pulse waveforms are input as the inputs "a" and "b", the pulse waveform "a" is output when the fuse blows whereas the pulse waveform "b" is output when the fuse does not blow (refresh inhibition). The waveform "a" may be output when the fuse does not blow whereas the waveform "b" is output when the fuse blows.

FIG. 12 shows an exemplary block diagram of the refresh-limit releasing section 12 shown in FIGS. 10 and 11. The refresh-limit releasing section 12 shown in FIG. 12 includes a fuse circuit F and a refresh-limit releasing circuit 17.

FIG. 13 shows an exemplary block diagram of a refresh-limit releasing section 12, which may be of the counterpart shown in FIG. 2(b), including a bonding option 18 and a refresh-limit releasing circuit 17.

Figure 14:
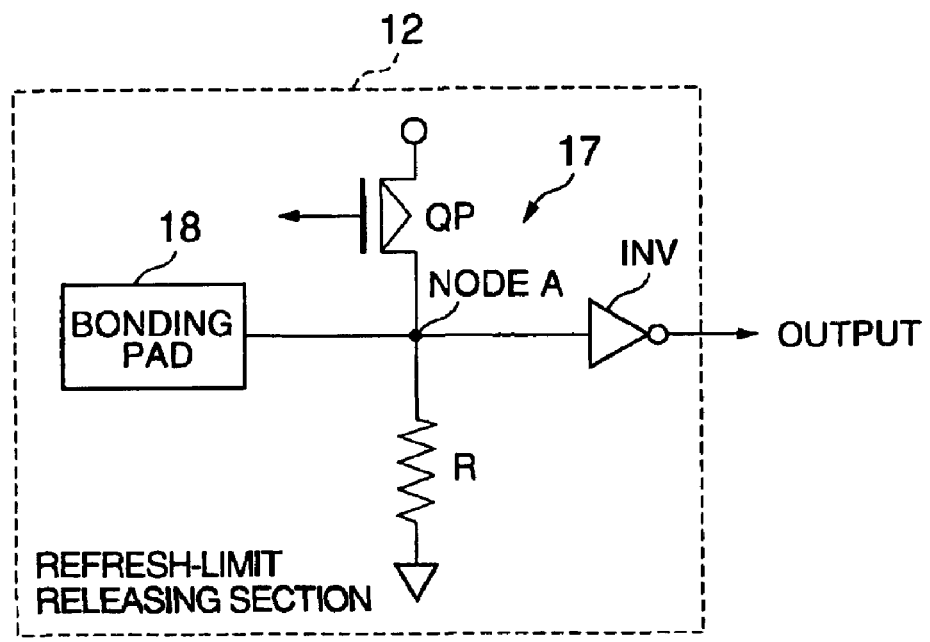
FIG. 14 shows an exemplary block diagram of a refresh-limit releasing section.
Figure 15:
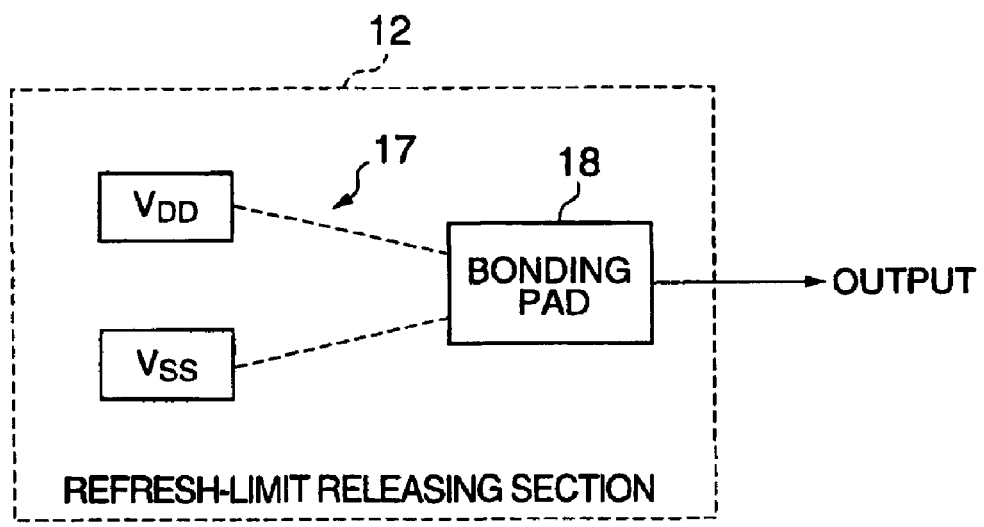
FIG. 15 shows an exemplary block diagram of a refresh-limit releasing section.

Further detailed exemplary circuitries are shown in FIGS. 14 and 15.

A refresh-limit releasing section 12 shown in FIG. 14 includes a bonding pad 18 and a refresh-limit releasing circuit 17. The circuit 17 consists of a P-channel transistor QP, a resistor R of high resistance, and an inverter INV connected to a node A at which the transistor QP and the resistor R are connected to each other.

In operation, a high-level voltage (almost $V_{DD}$) appears at the node A when the bonding pad 18 is floating, thus a low-level voltage (0V) being output.

FIG. 15 illustrates refresh-limit release by supplying $V_{DD}$ or $V_{ss}$ to the bonding pad 18, as indicated by dot lines 17. In detail, refresh-limit release may be made by supplying $V_{DD}$ to the bonding pad 18, thus a high-level voltage being output. Or, it may be made by supplying $V_{ss}$ to the bonding pad 18, thus a low-level voltage being output.

Refresh limit and refresh-limit release may be made at reverse potentials in FIGS. 14 and 15.

FIGS. 16 to 20 show several block diagrams different in refresh-limit release made by the refresh-limit release section 12.

Figure 16:
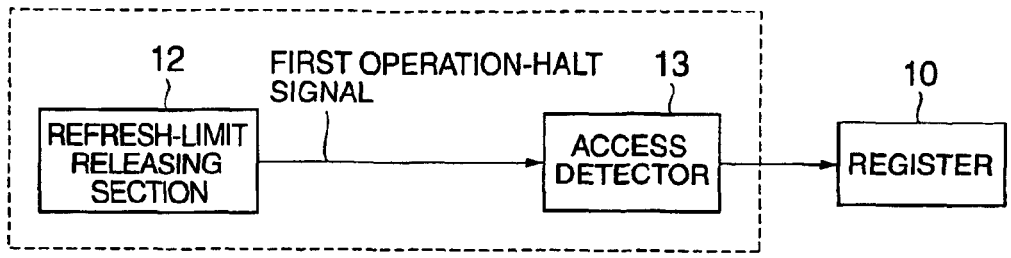
FIG. 16 shows an exemplary block diagram of a refresh-limit releasing section and an access detector.

A refresh-limit release section 12 shown in FIG. 16 supplies a first operation-halt signal to the access detector 13 for detecting external access to the cell array, to deactivate the detector 13 for refresh-limit release.

Figure 17:
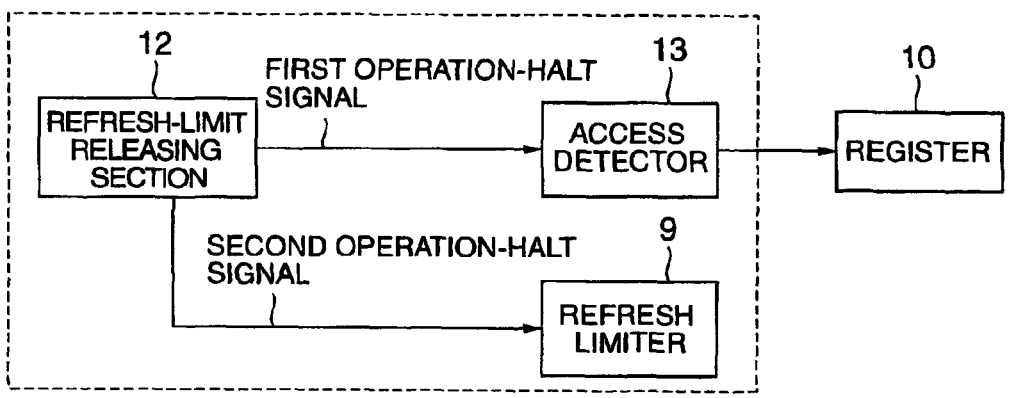
FIG. 17 shows an exemplary block diagram of circuitry including a refresh-limit releasing section, an access detector and a refresh limiter.

A refresh-limit release section 12 shown in FIG. 17 supplies a first operation-halt signal to the access detector 13 to detect external access to the cell array, to deactivate the detector 13 for refresh-limit release, and also a second operation-halt signal to the refresh limiter 9, to deactivate the limiter 9 for refresh-limit release.

Figure 18:
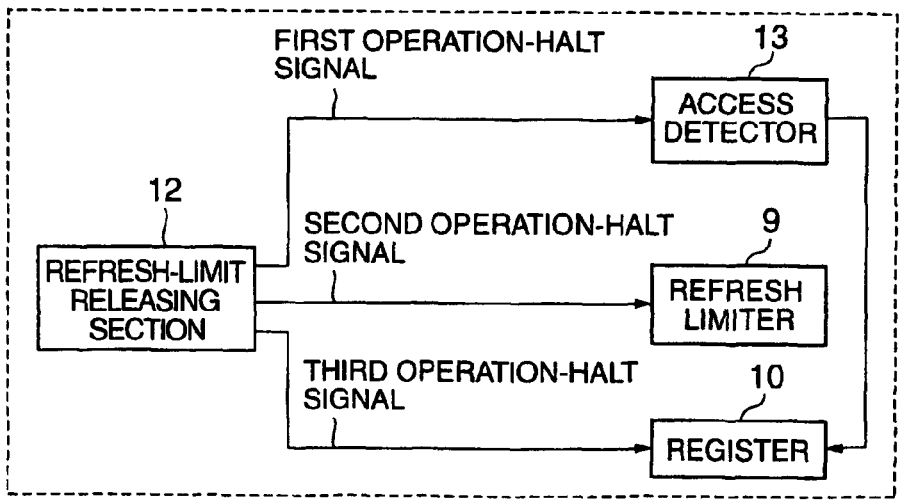
FIG. 18 shows an exemplary block diagram of circuitry including a refresh-limit releasing section, an access detector, a refresh limiter and a register.

A refresh-limit release section 12 shown in FIG. 18 supplies a first, a second and a third operation-halt signal to the access detector 13, the refresh limiter 9 and the register 10, respectively, to deactivate all of the detector 13, the refresh limiter 9 and the register 10 for refresh-limit release.

Figure 19:
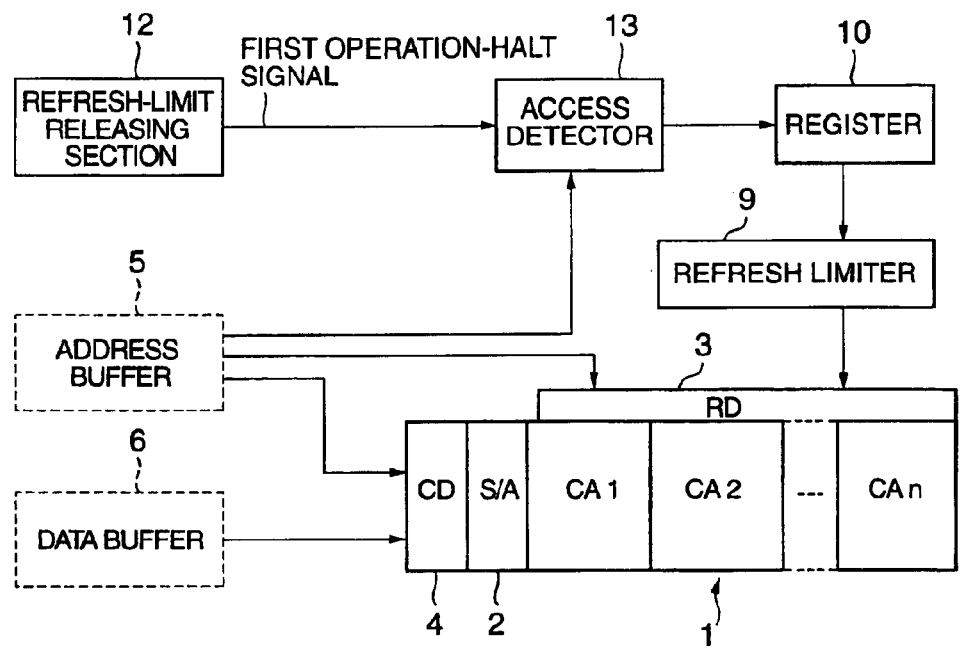
FIG. 19 shows a block diagram of circuitry for halting a refresh limiter with a first operation-halt signal.

FIG. 16 shows deactivation of the access detector 13 only with the first operation-halt signal. In an actual application, however, as shown in FIG. 19, the access detector 13 is deactivated when access has been made to the row decoder 3 of the cell array 1 for which the detector 13 has detected the address buffer 5's operation, thus certain blocks among the cell-array blocks CA1 to CAn being released from refresh limit via the register 10 and the refresh limiter 9.

Figure 20:
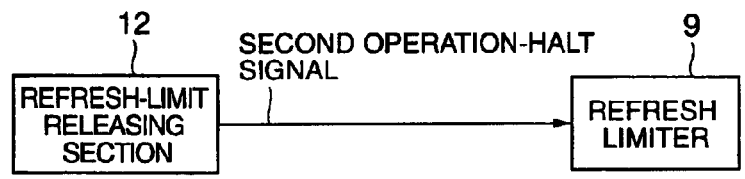
FIG. 20 shows an illustration of a flow of a second operation-halt signal from a refresh-limit releasing section to a refresh limiter.

A refresh-limit release section 12 shown in FIG. 20 supplies the second operation-halt signal to the refresh limiter 9, to deactivate the limiter 9 for refresh-limit release.

Figure 21:
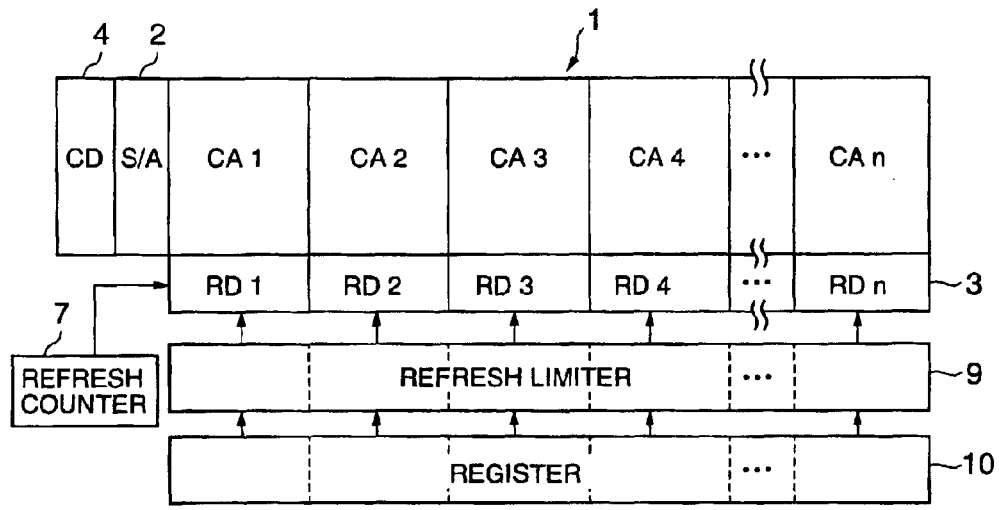
FIG. 21 shows a block diagram of circuitry including a refresh counter and a refresh limiter between a cell array and a register.

A DRAM shown in FIG. 21 is equipped with: a cell array 1 having DRAM cells, each cell being drive through via a word line for data transfer between a bit line, the DRAM cells being divided into blocks CA1 to CAn; decoders 3 and 4 selecting word and bit lines, respectively; a sense amplifier 2 for amplifying bit-line data from the cell array; and a refresh counter 7 for generating an internal address increased for each cell refresh; a register 10, provided per block, for storing information indicating whether access has been made to each of the blocks CA1 to CAn; and a refresh limiter 9 for refresh limitation to any of blocks CA1 to CAn to which no access has been made.

Figure 22:
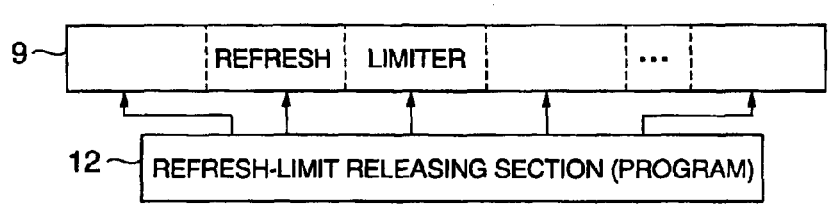
FIG. 22 shows a block diagram illustrating release of a refresh limiter from refresh limitation with data programming to a refresh-limit releasing section.

A DRAM shown in FIG. 22 is equipped with a refresh-limit releasing section 12 that is data programmable for refresh-limit release against the refresh limiter 9, in addition to the circuitry shown in FIG. 21.

Figure 23:
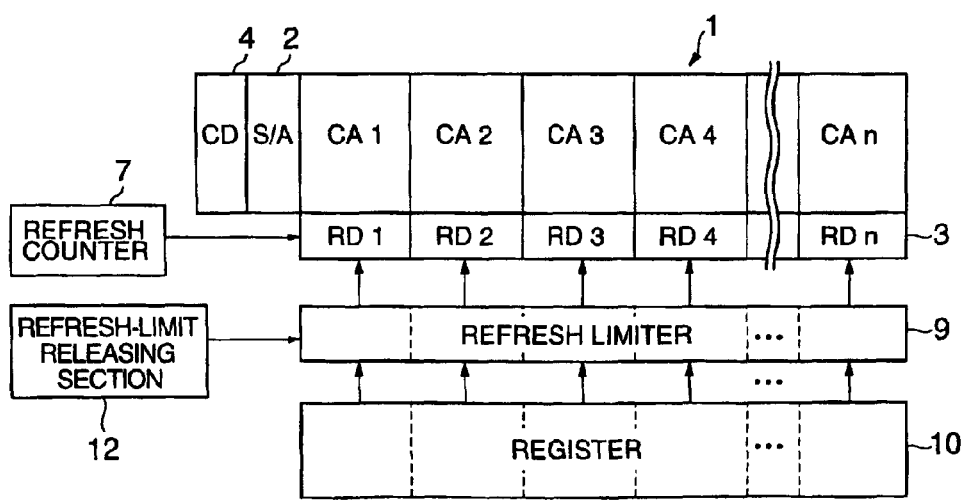
FIG. 23 shows a block diagram of circuitry including a refresh counter, a refresh limiter and a refresh-limit releasing section between a cell array and a register.

A DRAM shown in FIG. 23 having a refresh limiting function under control by an internal refresh-control signal is equipped with: a cell array 1 having DRAM cells, each being driven through a word line for data transfer between a bit line, the DRAM cells being divided into blocks CA1 to CAn; decoders 3 and 4 selecting word and bit lines, respectively; a sense amplifier 2 for amplifying bit-line data from the cell array; and a refresh counter 7 for generating an internal address increased for each cell refresh; a register 10, provided per block, for storing information indicating whether access has been made to each of the blocks CA1 to CAn; a refresh limiter 9 for refresh limitation to any of blocks CA1 to CAn to which no access has been made; and a refresh-limit releasing section 12 that is data programmable for refresh-limit release against the refresh limiter 9.

What is claimed is:

1. A dynamic random access memory (DRAM) having a refresh-control function under control by an internal refresh-control signal comprising:
   a cell array having a plurality of DRAM cells divided into a plurality of blocks, the DRAM cells being driven through word lines for data transfer with bit lines;
   a decoder to select word lines and bit lines connected to the cell array;
   a sense amplifier to amplify data on the bit lines; and
   a refresh controller to limit refresh to the cell array so that at least one externally-accessed block cell among the blocks is refreshed;
   wherein the refresh controller comprises:
     a refresh counter to generate an internal address signal, the address being increased for each refresh to the cell array;
     a register, provided per block of the cell array, the register storing information indicating whether each block has been accessed;
     a refresh limiter to halt refresh to each block that has not been accessed; and
     a refresh-restriction releasing section that is data programmable for releasing the refresh limiter from refresh limit to the cell array.

2. The DRAM according to claim 1, wherein the register stores information indicating whether there is a write access to each block.

3. The DRAM according to claim 1 further comprising an external reset terminal through which the information stored in the register is initialized per block of the cell array.

4. The DRAM according to claim 1 further comprising a reset circuit to initialize the information stored in the register.

5. The DRAM according to claim 1, wherein the refresh-restriction releasing section includes a fuse circuit.

6. The DRAM according to claim 1, wherein the refresh-restriction releasing section includes a bonding option.

7. The DRAM according to claim 1 further comprising an access detector to detect an external access to the cell array, the refresh-restriction releasing section generating a first operation-halt signal to deactivate the access detector to release the cell array from refresh limit.

8. The DRAM according to claim 7, wherein the refresh-restriction releasing section generates a second operation-halt signal to deactivate the refresh limiter to release the cell array from refresh limit.

9. The DRAM according to claim 8, wherein the refresh-restriction releasing section generates a third operation-halt signal to deactivate the register, thus deactivating all of the access detector, the refresh limiter and the register to release the cell array from refresh limit.

10. The DRAM according to claim 7, wherein the refresh-restriction releasing section generates only the first operation-halt signal to the access detector while the refresh limiter is active, with the register being set at non-active, to release the cell array from refresh limit.

11. The DRAM according to claim 1, wherein the refresh-restriction releasing section generates a second operation-halt signal to the refresh limiter for deactivating the refresh limiter, to release the cell array from refresh limit.

12. A dynamic random access memory (DRAM) having a refresh-control function under control by an internal refresh-control signal comprising:

a cell array having a plurality of DRAM cells divided into a plurality of blocks, the DRAM cells being driven through word lines for data transfer with bit lines;

a decoder to select word lines and bit lines;

a sense amplifier to amplify data on the bit lines;

a refresh counter to generate an internal address signal, the address being increased for each refresh to the cell array;

a register, provided per block of the cell array, the register storing information indicating whether each block has been accessed;

a refresh limiter to halt refresh to each block that has not been accessed; and a refresh-restriction releasing section that is data programmable for releasing the refresh limiter from refresh limit to the cell array.

13. The DRAM according to claim 12, wherein the refresh-restriction releasing section includes a fuse circuit.

14. The DRAM according to claim 12, wherein the refresh-restriction releasing section includes a bonding option.

* * * * *